(12) United States Patent  
Casabianca et al.

(10) Patent No.: US 9,159,644 B2  
(45) Date of Patent: Oct. 13, 2015

(54) MANUFACTURING OF DSC TYPE ELECTRONIC DEVICES BY MEANS OF SPACER INSERT

(71) Applicant: STMicroelectronics S.r.l., Agrate Brianza (MB) (IT)

(72) Inventors: Tommaso Casabianca, Viagrande (IT); Cristiano Gianluca Stella, San Gregorio di Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 458 days.

(21) Appl. No.: 13/629,156

(22) Filed: Sep. 27, 2012

(65) Prior Publication Data

US 2013/0154155 A1  Jun. 20, 2013

(30) Foreign Application Priority Data

Dec. 19, 2011  (IT) ............................... MI2011A2300

(51) Int. Cl.
| | |
|---|---|
| *H01L 23/433* | (2006.01) |
| *H01L 23/495* | (2006.01) |
| *H01L 21/56* | (2006.01) |
| *A01B 1/00* | (2006.01) |

(52) U.S. Cl.  
CPC .......... *H01L 23/4334* (2013.01); *H01L 21/565* (2013.01); *H01L 23/49562* (2013.01); *H01L 2224/48091* (2013.01); *H01L 2924/13091* (2013.01)

(58) Field of Classification Search  
CPC ........................ H01L 21/563; H01L 23/49513  
USPC .............. 264/272.11, 272.12, 272.14, 272.17  
See application file for complete search history.

(56) References Cited

U.S. PATENT DOCUMENTS

| | | | |
|---|---|---|---|
| 5,344,600 A | | 9/1994 | McShane et al. |
| 5,776,796 A | * | 7/1998 | Distefano et al. ............. 438/106 |
| 7,247,929 B2 | * | 7/2007 | Miura et al. ................... 257/675 |
| 2002/0158333 A1 | * | 10/2002 | Teshima ........................ 257/718 |
| 2006/0043618 A1 | | 3/2006 | Ashida et al. |
| 2006/0108700 A1 | | 5/2006 | Nakazawa et al. |

(Continued)

FOREIGN PATENT DOCUMENTS

JP  58034951 A  3/1983

OTHER PUBLICATIONS

Italian Search Report and Written Opinion for IT MI2011A002300 mailed Aug. 10, 2012 (7 pages).

(Continued)

*Primary Examiner* — Mohamed K Ahmed Ali  
(74) *Attorney, Agent, or Firm* — Gardere Wynne Sewell LLP

(57) ABSTRACT

A DSC type device manufacturing process includes placing a circuit assembly in a mold. The circuit assembly includes a first heat sink, a semiconductor chip mounted on the first heat sink, a second heat sink mounted on the semiconductor chip and a pin block electrically connected to the semiconductor chip. An outer surface of the first heat sink and an outer surface of the pin block are placed in contact with a first inner surface of the mold. A spacer insert is placed in contact with, and positioned between, a second inner surface of the mold and an outer surface of the second heat sink. The mold is filled with an insulating material that is subsequently hardened. After hardening, a resulting device is extracted from the mold with the outer surfaces of the first heat sink, the pin block and the second heat sink exposed.

18 Claims, 4 Drawing Sheets

(56) References Cited

U.S. PATENT DOCUMENTS

| | | |
|---|---|---|
| 2007/0052072 A1 | 3/2007 | Iwade et al. |
| 2010/0032816 A1 | 2/2010 | Mahler et al. |
| 2010/0176508 A1 | 7/2010 | Herbsommer et al. |
| 2012/0014069 A1 | 1/2012 | Zeng et al. |

OTHER PUBLICATIONS

First Office Action for counterpart DE 102012023644.1, mailed on Jan. 7, 2014 (8 pages).

* cited by examiner

MANUFACTURING OF DSC TYPE ELECTRONIC DEVICES BY MEANS OF SPACER INSERT

PRIORITY CLAIM

This application claims priority from Italian Application for Patent No. MI2011A002300 filed Dec. 19, 2011, the disclosure of which is hereby incorporated by reference.

TECHNICAL FIELD

The solution according to one or more embodiments refers to the field of electronics. In more detail, the solution according to one or more embodiments concerns the manufacturing of Dual Side Cooling (DSC) type electronic devices.

BACKGROUND

Generally, any electronic device comprises a chip (or more) of semiconductor material on which an actual electronic component is integrated. The chip is usually encapsulated in a package of insulating material in order to be insulated and protected from the external environment. The package exposes conductive pins, which are coupled with corresponding conductive terminals of the chip. For example, such result is achieved through an injection molding operation of plastic material.

Various types of packages are used in the state of the art, which packages are selected according to the application field of the electronic device.

For example, the scaling process of the electronic devices has led to a wide spread of Surface-Mounting Technology (SMT) electronic devices. Particularly, a type of SMT electronic devices has pins exposed on a (lower) surface for mounting the package of the electronic device on a Printed Circuit Board (PCB)—known in the art as "No-Lead" or "Micro-Lead".

In addition, the SMT electronic devices may also be provided with a (lower) heat sink that is exposed on the mounting surface for dissipating the heat generated by the electronic component during operation (also referred to by means of the acronym EP—Exposed thermal Pad).

The use of electronic components characterized by a high power consumption (for example, power electronic components and central processing units) has led to the development of electronic devices with a further (upper) heat sink, this time exposed on a free (upper) surface of the package opposite the mounting surface, in such a way to dissipate a greater amount of heat produced by the electronic component (also referred to by means of the acronym DSC—Dual Side Cooling).

A known technique (for the manufacturing of electronic devices with exclusively upwards dissipation) provides for forming the package in such a way that the chip is exposed on the upper surface; an upper heat sink may then be fixed directly on the exposed surface of the chip. However, this requires modifying corresponding injection molds of the plastic material (with a consequent increase of the manufacturing costs); furthermore, in the electronic device thus obtained the chip is not insulated from the external environment. Therefore, the operation of the electronic component may be affected by moisture and foreign bodies (e.g., dirt particles) present in the external environment that, by coming into contact with the exposed surface of the chip, may cause malfunctions of the electronic component.

According to another known technique for the manufacturing of electronic devices with upwards dissipation (comprising the DSC electronic devices), the heat sink is fixed onto the chip prior to the molding operation, so that it is fully embedded in the package at the end thereof; at this point, the package is lapped for exposing the upper heat sink. However, this technique involves a mechanical strain for all the elements of the electronic device (chip, package, pins and mechanical connections between them) during the lapping, which may get to damage the electronic device and, consequently, to impair the proper functioning thereof (with subsequent reduction of the manufacturing yield). Moreover, it requires the addition of the lapping operation for the packages, and therefore of machineries necessary for performing such operation (with consequent increase of the manufacturing costs).

SUMMARY

In general terms, the solution according to one or more embodiments is based on the idea of using spacer inserts for directly exposing the heat sinks.

In particular, one or more aspects of the solution according to specific embodiments are set out in the independent claims, with advantageous features of the same solution that are set out in the dependent claims, whose wording is herein incorporated verbatim by reference (with any advantageous features provided with reference to a specific aspect of the solution according to an embodiment that apply mutatis mutandis at any other aspect thereof).

More specifically, an aspect of a solution according to an embodiment provides a process for manufacturing DSC type electronic devices, in which a first heat sink is placed in contact with an inner surface of the mold and a second heat sink is placed in contact with a spacer insert, so that both heat sinks are exposed from a corresponding package.

BRIEF DESCRIPTION OF THE DRAWINGS

A solution according to one or more embodiments, as well as additional features and its advantages will be better understood with reference to the following detailed description, given purely by way of a non-restrictive indication and without limitation, to be read in conjunction with the attached figures (wherein corresponding elements are denoted with equal or similar references and their explanation is not repeated for the sake of brevity). In this respect, it is expressly understood that the figures are not necessarily drawn to scale (with some details that may be exaggerated and/or simplified) and that, unless otherwise specified, they are simply intended to conceptually illustrate the structures and procedures described herein. In particular.

DETAILED DESCRIPTION OF THE DRAWINGS

Figure 1A:
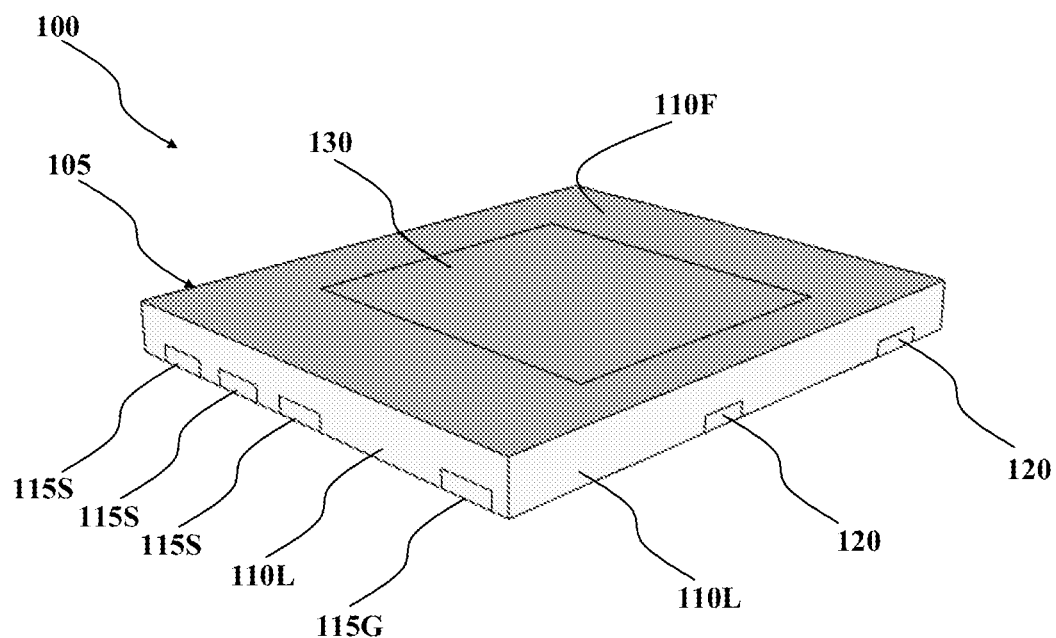
FIG. 1A and FIG. 1B schematically illustrate a perspective view from above and from below, respectively, of an electronic device to which the solution according to an embodiment may be applied.
Figure 1B:
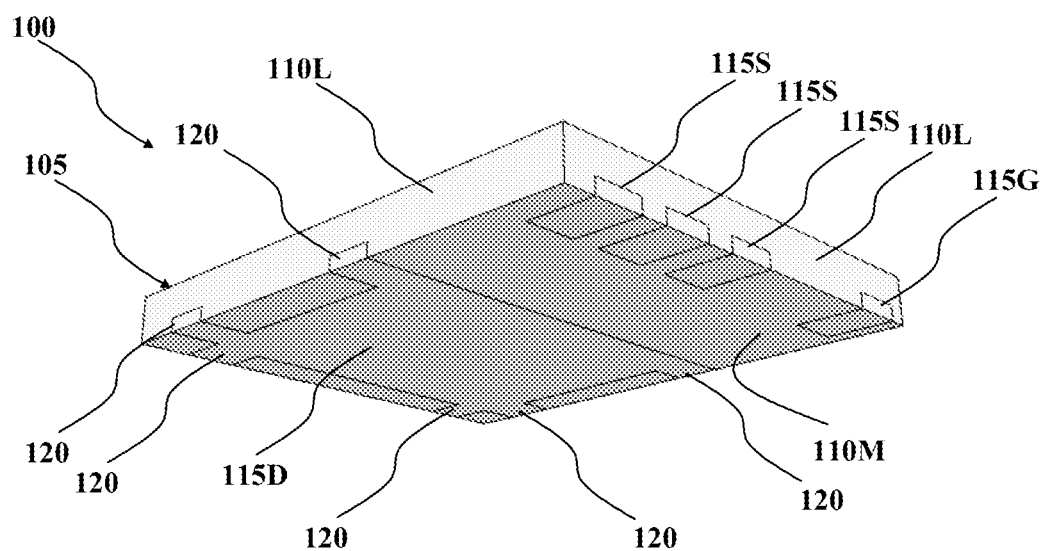

With reference to FIG. 1A and FIG. 1B together, there are schematically illustrated perspective views from above and from below, respectively, of an electronic device 100 to which the solution according to an embodiment may be applied. The electronic device 100 is of the DSC type; in particular, in the example at issue, the electronic device 100 is of the No-Lead SMT type.

The electronic device 100 comprises a package 105 formed by an insulating body (e.g., made of plastic, epoxy or ceramic) substantially parallelepiped-shape. The package 105 has two main surfaces, namely a mounting surface 110M (for the mounting on a PCB, not shown) and a free surface 110F opposite thereto; the mounting surface 110M and the free surface 110F are separated by four side surfaces 110L.

The package 105 is designed for protecting and insulating, from the external environment, a chip of semiconductor material (or more), not visible in the figures, on which an electronic component—for example, a power MOS transistor—is integrated. In order to obtain an electrical path between the chip and elements external to the electronic device 100—thereby allowing connecting the electronic component to other electronic devices not shown in the figure—various conductive pins are exposed from the package 105—for example, three source pins 115S, a gate pin 115G and a drain pin 115D in the case of the MOS transistor; each pin 115S, 115G, 115D is formed by a pad in electrical contact with corresponding conduction terminals of the chip (as will be described in more detail below). The source pins 115S and the gate pin 115G are generally rectangular shaped, and are exposed in part on the mounting surface 110M and in part on a side surface 110L of the package 105 (on the left and on the right in FIG. 1A and in FIG. 1B, respectively). Conversely, the drain pin 115D is exposed only on the mounting surface 110M; the drain pin 115D is generally rectangular-shaped, and extends on about a half of the mounting surface 110M. The drain pin 115D also defines a surface being exposed from the package 105 of a lower heat sink (not shown in the figure) for the chip. A plurality of tie-bars 120 (used for supporting the lower heat sink during the manufacturing of the package 105, as will be described in the following, and then electrically connected thereto) protrude, for example, in pairs, on each side surface 110L of the package 105, excluding the side surface 110L on which the pins 115S and 115G extend.

In addition, a further pad 130 is exposed on the free surface 110F; the pad 130 is generally rectangular-shaped, and covers about a half of the free surface 110F. The pad 130 defines a surface being exposed from the package 105 of an upper heat sink (not shown in the figure) for the chip.

Figure 2A:
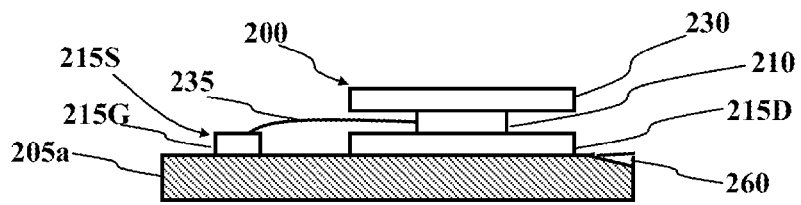
FIGS. 2A-2C schematically illustrate various steps of a process of manufacturing such electronic device according to an embodiment.
Figure 2B:
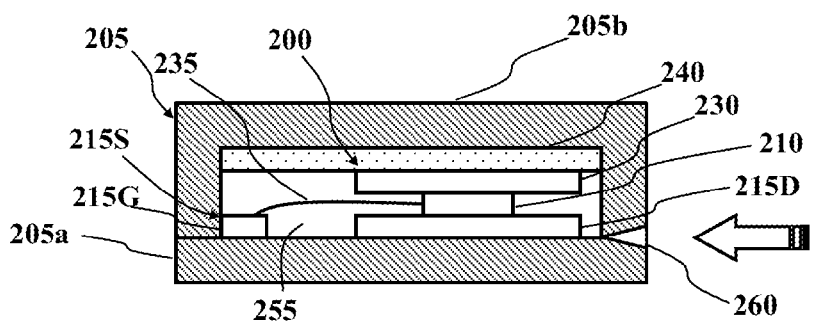
Figure 2C:
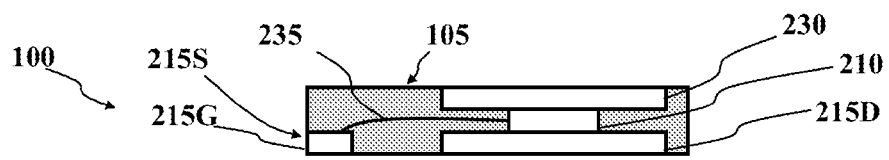

Referring now to the FIGS. 2A-2C jointly, they schematically illustrate various steps of a manufacturing process of the electronic device according to an embodiment.

Starting from the FIG. 2A, an assembly 200 (precursor of the desired electronic device) is placed into a lower half-mold 205a.

The assembly 200 comprises the lower heat sink indicated by the reference 215D (a lower surface of which defines the drain terminal 115D), a pin block 215G and three pin blocks 215S—behind the pin block 215G in the figures—(which lower and outer surfaces define the gate pin 115G and the source pins 115S, respectively), the chip (indicated by the reference 210) mounted on an upper surface of the lower heat sink 215D, and the upper heat sink indicated by the reference 230 (an upper surface of which defines the pad 130) mounted on an upper (free) surface of the chip 210. The lower heat sink 215D is made of electrically and thermally conductive material, the pin blocks 215S and the pin block 215G are made of electrically conductive material, and the upper heat sink 230 is made of thermally conductive material (e.g., all of metallic material such as copper). The lower heat sink 215D, the pin blocks 215S and the pin block 215G (and hence the drain pin, the source pins and the gate pin, respectively) are electrically coupled with corresponding conductive terminals (not shown in the figures) of the chip 210. For example, the lower heat sink 215D is directly coupled with a drain terminal of the chip 210, while the pin blocks 215S and 215G are coupled with a source terminal and with a gate terminal of the chip 210, respectively, by a wired connection 235 (by means of a technique known as wire bonding). Moreover, the upper heat sink 230 may be electrically coupled with the source terminal of the electronic component (and thus to the pin blocks 215S as well).

The assembly 200 is placed into the lower half-mold 205a with the lower surface of the lower heat sink 215D in contact with a corresponding inner (upper) surface of the lower half-mold 205a. In the particular embodiment at issue (in which the electronic device is of the No-Lead type), also the lower surface of the pin blocks 215S and 215G is placed in contact with the same inner surface of the lower half-mold 205a.

Turning to FIG. 2B, an upper half-mold 205b is coupled with the lower half-mold 205a for forming a complete mold (simply referred to by means of the reference 205), within which the assembly 200 is enclosed. In the particular embodiment at issue, an internal cavity of the upper half-mold 205b has a cross-section matching the assembly 200, so that an outer side surface of the pin blocks 215S and 215G is in contact with the inner side surfaces of the upper half-mold 205b.

In the solution according to an embodiment, a spacer insert 240 is placed within the upper half-mold 205b. The spacer insert 240 has a shape matching the internal cavity of the upper half-mold 205b, and a height corresponding to a difference between the depth of the internal cavity of the upper half-mold 205b and the height of the assembly 200. Consequently, in the mold 205 there if formed a cavity 255 (with reduced height) adapted to the height of the assembly 200. Therefore, when the upper half-mold 205b is coupled with the lower half-mold 205a, the spacer insert 240 is in contact with a free (upper) surface of the upper heat sink 230.

At this point, an insulating material substantially in the liquid phase (e.g., a liquefied polymer, conceptually indicated by an arrow in FIG. 2B) is injected into the cavity 255 through a nozzle 260 of the mold 205. In the particular embodiment at issue, the nozzle 260 is formed in part on the lower half-mold 205a and in part on the upper half-mold 205b, so that when the two half-molds 205a and 205b are coupled together, the nozzle 260 is complete.

Subsequently, the insulating material is brought from the liquid phase to the solid phase (e.g., by cooling the mold in the case in which the insulating material is in the liquid phase at temperatures above the room temperature).

Finally, the half-mold 205a and 205b are separated from each other and the resulting electronic device 100, shown in cross section in FIG. 2C, is removed; as may be noted, the hardened insulating material forms the package 105 that embeds the assembly 200. In addition, the lower surface of the lower heat sink 215D is exposed from the mounting surface 110M of the package 105 for defining the drain pin 115D; in the particular embodiment at issue, the pin blocks 215S and 215D are also exposed from the mounting surface 110M and from the corresponding side surface 110L of the package 105 for defining the source pins (not visible in the figure) and the gate pin 115G, respectively.

In the solution according to an embodiment, at the same time the upper surface of the upper heat sink 230 is exposed from the free surface 110F of the package 105 for defining the pad 130.

This allows for using the already existing mold, with consequent reduction of the manufacturing costs.

Moreover, in this way the chip 210 is completely embedded in the package 105, so that the operation of its electronic component is not affected (or it is only affected to a small extent) by moisture and foreign bodies from the external environment that may cause malfunctions of the electronic component.

Such result is obtained without requiring any lapping operation on the package 105 which subjects the elements of the electronic device 100 to mechanical stresses that might damage the electronic device 100 and, consequently, impair the proper operation thereof (with consequent increase of the manufacturing yield).

Moreover, in this way the machineries required for performing such operation are not required (with a consequent reduction of the manufacturing costs).

The specific embodiment described above offers further advantages.

In particular, the entire spacer is preferably made of elastic material (for example, heat-resistant rubber).

The elasticity of the spacer insert prevents the electronic assembly from undergoing any crushing during the coupling of the half-molds. In addition, the spacer insert fits the exposed surface of the heat sink 230, ensuring complete exposure of the corresponding pad from the free surface 110F of the package 105. This also helps compensating any inaccuracies in the parallelism of the elements that form the assembly.

Figure 2D:
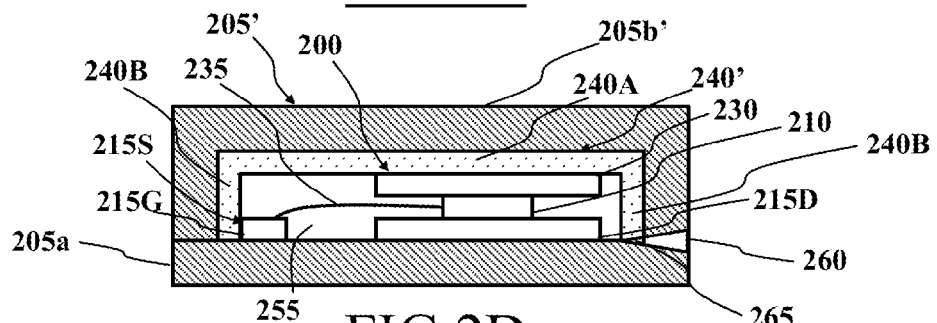
FIG. 2D schematically illustrates an alternative step of the manufacturing process of the same electronic device according to an embodiment.

An alternative step of the manufacturing process of the same electronic device according to an embodiment is illustrated in the FIG. 2D.

In this case, a different upper half-mold 205b' is used, whose internal cavity has a larger cross-section with respect to the assembly 200, so that the pin blocks 215S and 215G are spaced apart from the inner side surfaces of the upper half-mold 205b'.

In the solution according to an embodiment, within the upper half-mold 205b' a different spacer insert 240' is arranged. The spacer insert 240' comprises a main portion 240A with a shape matching the inner cavity of the upper half-mold 205b, and a height corresponding to a difference between the depth of the internal cavity of the upper half-mold 205b and the height of the assembly 200. A side portion 240B extends from an edge of the main portion 240A down to reach the lower half-mold 205a. The side portion 240B is designed to be in contact with the outer side surface of the pin blocks 215S and 215G. In addition, the spacer insert 240' may be provided with a through hole 265 that is aligned with the injection nozzle 260 of the insulating material when the two half-molds are coupled together.

This allows using the existing mold also for manufacturing electronic devices with smaller footprint, with consequent reduction of the manufacturing costs.

Figures 2E, 2F:
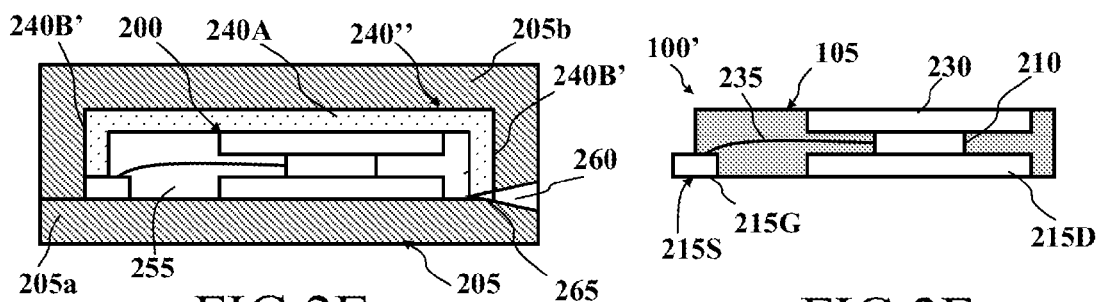
FIGS. 2E-2F schematically illustrate the steps of the manufacturing process of a different electronic device according to an embodiment.

Various steps of the manufacturing process of a different electronic device according to an embodiment are illustrated in FIGS. 2E-2F.

Starting from FIG. 2E, in this case the same upper half-mold 205b (having the cross-section matching the assembly 200), but a different spacer insert 240" are used. The spacer insert 240"comprises the same main portion 240A but a different side portion 240B'. The side portion 240B' extends from the main portion 240A down to reach the lower half-mold 205a, with the exception of sites where the pin blocks 215S, 215G are provided; at these sites, the side portion 240B instead reaches an upper surface of the pin blocks 215S and 215G.

Consequently, after the insulating material has been injected and hardened, when the half-molds 205a and 205b are decoupled a different electronic device 100' is obtained; in this case, the hardened insulating material forms a package 105' that embeds the assembly 200, but with the pin blocks 215S, 215G now protruding laterally from the package 105'.

Figure 3A:
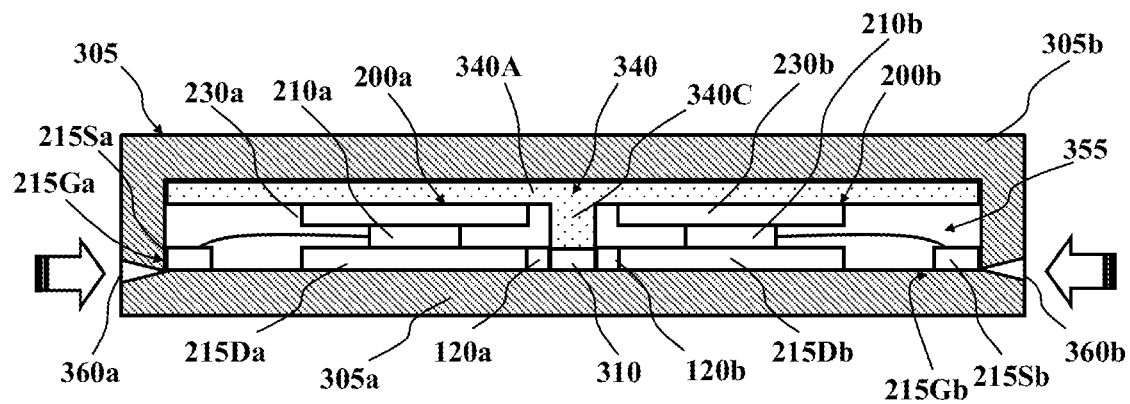
FIGS. 3A-3B schematically illustrate various steps of a manufacturing process of a pair of electronic devices of the FIGS. 1A-1B according to another embodiment.
Figure 3B:
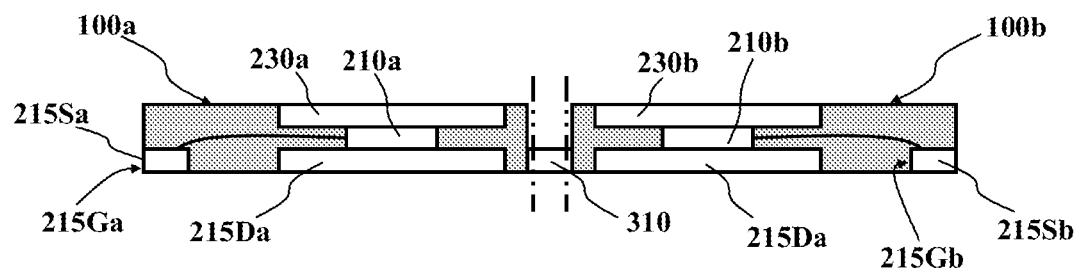

Referring now to the FIGS. 3A-3B together, they schematically illustrate various steps of a manufacturing process of a pair of electronic devices of the FIGS. 1A-1B according to another embodiment.

Starting from FIG. 3A, in this case on a single half-mold 305a a pair of the above-described assemblies is placed, distinguished by adding the suffixes a and b to their references and to the ones of the corresponding components. The assemblies 200a and 200b are joined together by two sacrificial joints 310, each of which connects corresponding tie-bars 120a and 120b opposite to the pin blocks 215Sa, 215Sb and 215Ga, 215Gb.

A single upper half-mold 305b is coupled with the lower half-mold 305a for forming a complete mold (simply referred to by means of the reference 305), within which both the assemblies 200a and 200b are enclosed (with an internal cavity of the upper half-mold 305b that has a cross-section matching the pair of assemblies 200a and 200b, so that an outer side surface of the pin blocks 215Sa, 215Ga and 215Sb, 215Gb is in contact with inner side surfaces of the upper half-mold 305b).

In the solution according to an embodiment, a single spacer insert 340 is arranged within the upper half-mold 305b. The spacer insert 340 comprises a main portion 340A with a shape matching the inner cavity of the upper half-mold 305b, and a height corresponding to a difference between the depth of the internal cavity of the upper half-mold 305b and the height of the assemblies 200a, 200b. A septum 340C extends from a central region of the main portion 340A down to reach the lower half-mold 305a, with the exception of sites where the sacrificial joints 310 are provided; at these sites, the septum 340C instead reaches an upper surface of the sacrificial joints 310. As above, in the mold 305 a cavity 355 is formed, with the main portion 340A of the spacer insert 340 in contact with the (upper) free surfaces of the heat sinks 230a, 230b.

At this point, the insulating material in the liquid phase is injected into the cavity 355 through a nozzle 360a and a nozzle 360b of the mold 305, in correspondence to the assemblies 200a and 200b, respectively. Subsequently, the insulating material is brought to the solid phase, and the half-molds 305a and 305b are separated from each other in order to obtain two electronic devices with respective packages (indicated by the references 100a, 100b and 105a, 105b, respectively), which are joined together by the sacrificial joints 310.

At this point, the sacrificial joints 310 are removed by cutting them (as shown by corresponding dotted lines in FIG. 3B), in such a way to separate the two electronic devices 100a and 100b.

The manufacturing process of electronic devices just described may simultaneously produce two electronic devices 100a and 100b at each iteration thereof.

Figure 4A:
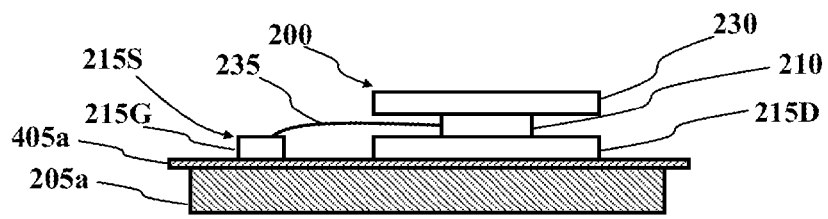
FIGS. 4A and 4B schematically illustrate various steps of a manufacturing process of the electronic device of the FIGS. 1A-1B according to another embodiment, and FIGS. 5A and 5B schematically illustrate various steps of a manufacturing process of a batch of electronic devices of the FIGS. 1A-1B according to another embodiment.
Figure 4B:
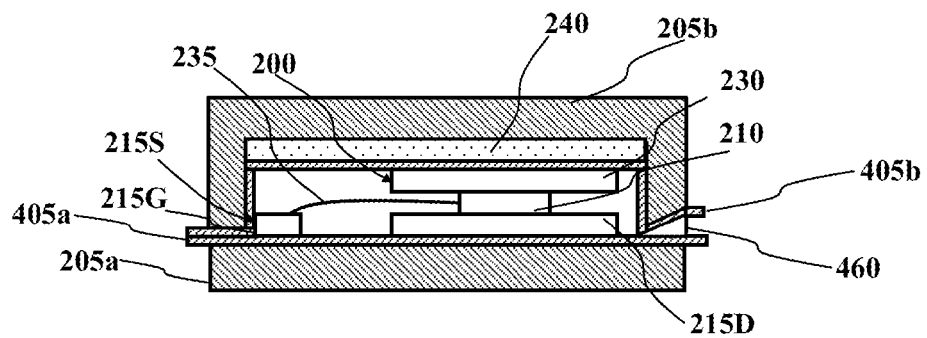

Referring now to the FIGS. 4A-4B together, they schematically illustrate the various steps of a manufacturing process of the electronic device of FIGS. 1A-1B according to another embodiment.

In FIG. 4A a protective element, such as a protective sheet 405a of a heat-resistant material (for example, a sheet of polytetrafluoroethylene, better known as Teflon®) is interposed between the top surface of the lower half-mold 205a and the lower surface of the assembly 200—i.e., in contact with the lower surfaces of the pin blocks 215G, 215S and of the lower heat sink 215D. Turning to FIG. 4B, a further protective sheet 405b may be interposed between the top surface of the assembly 200 and the lower surface of the spacer insert 240 and laterally between the inner side surface of the upper half-mold 205b and the side surface of the upper heat sink 230 and of the pin blocks 215S and 215G. The manufacturing process then continues as described above.

This manufacturing process is particularly suitable for highly automated industrial manufacturing systems designed for large manufacturing volumes. In fact, the protection sheets 405a and 405b may reduce a consumption of the spacer insert 240 (due to compression thereof by the mold) and, at the same time, prevent direct contact between the mold and the insulating material. In this way, it is possible to substantially reduce a frequency and a duration of maintenance and cleaning operations of the mold. Indeed, any scraps of insulating material remain associated with the protection sheets 405a and 405b (instead of with the inner surfaces of the half-molds 205a and 205b) from which they may be easily and economically removed (e.g., by simply replacing these protective sheets 405a and 405b).

Figure 5A:
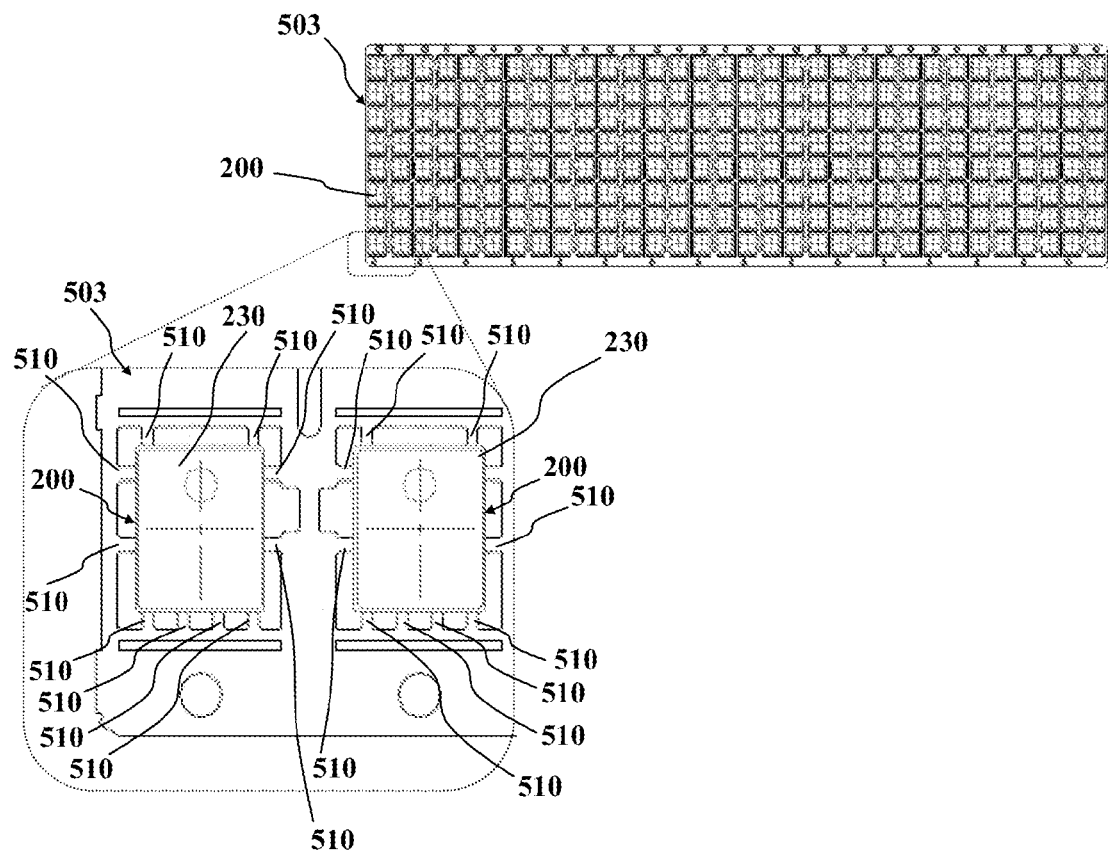
Figure 5B:
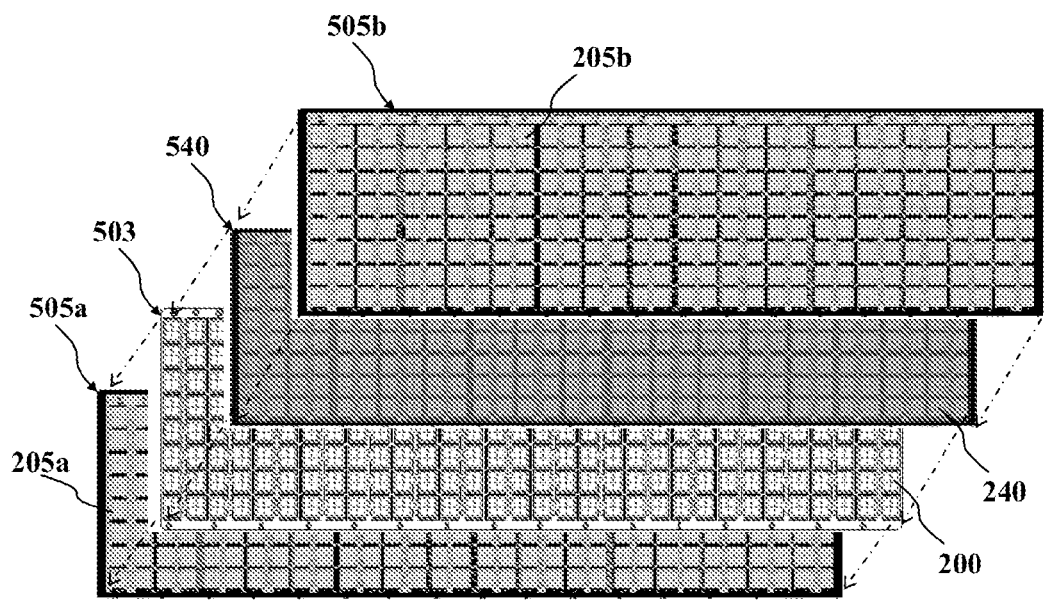

Referring now to the FIGS. 5A-5B together, they schematically illustrate various steps of a manufacturing process of a batch of electronic devices of the FIGS. 1A-1B according to another embodiment.

Starting from FIG. 5A, a batch of assemblies (each denoted by the same reference 200) have respective source pin blocks 215S, gate pin block 215G and lower heat sink 215D connected to a support structure (leadframe) 503 through respective sacrificial joints 510.

Turning to FIG. 5B, the leadframe 503 is arranged into a matrix of lower half-molds 505a comprising a number of lower half-molds (denoted by the same reference 205a) equal to that of the assemblies 200; as above, each assembly 200 is arranged onto a corresponding lower half-mold 205a.

A matrix of upper half-molds 505b is coupled with the matrix of lower half-molds 505a. The matrix of upper half-molds 505b comprises the same number of upper half-molds (indicated by the same reference 205b), in such a way to form the corresponding complete molds (indicated by the same reference 205), each of which houses an assembly 200. In addition, an array of spacer inserts 540 comprises the same number of spacer inserts (denoted by the same reference 240), each of which is placed within a corresponding upper half-mold 205b.

The manufacturing process then continues exactly as above, in parallel for all the molds 205, in order to obtain the same number of electronic devices (not shown in the figure), which are joined together by corresponding sacrificial joints. At this point, the sacrificial joints are removed by cutting them, in such a way to separate each electronic device 100 from the leadframe 503.

The manufacturing process of electronic devices described above may simultaneously produce a large number of electronic devices at each iteration thereof.

Also in this case, it is possible to place multiple assemblies in each mold and to use the upper and lower protection sheets (in this case adapted to cover each mold of the matrices of the upper and lower half-molds, respectively) in a similar manner as described above.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments may even be practiced without the specific details (such as the numerical examples) set forth in the preceding description to provide a more thorough understanding thereof conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice. In any case, the terms including, comprising, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved) and the term a should be understood as one or more elements (unless expressly stated otherwise).

For example, a solution according to an embodiment proposes a process for manufacturing DSC type electronic devices (of any type). The process involves the following steps. In each of a set of (one or more) molds at least one assembly is placed; the assembly comprises a first heat sink (of any type, shape and size), at least one chip of semiconductor material (on which a circuit is integrated) mounted on the first heat sink, a second heat sink (of any type, shape and size) mounted on said at least one chip and a plurality of pin blocks (in any number and of any type, shape and size) electrically connected to said at least one chip. The first heat sink has an outer surface in contact with a first inner surface of the mold. Each mold is filled with insulating material (of any type) in the liquid state. The insulating material is hardened (in any way—for example, thermally or chemically). A resulting electronic device is extracted from each mold; the hardened insulating material forms a protective package for said at least one chip, which exposes the outer surface of the first heat sink. In the solution according to an embodiment, a spacer insert (of any type, see below) is placed into each mold in contact with an outer surface of the second heat sink before filling the mold with the insulating material, in order to obtain the outer surface of the second heat sink exposed from the package when the corresponding electronic device is removed from the mold.

However, similar considerations apply if the same solution is implemented with an equivalent process (using similar steps with the same functions of more steps or portions thereof, removing some unessential steps, or adding further optional steps); moreover, the steps may be executed in different order, in parallel or overlapped (at least in part).

In an embodiment, the step of placing a spacer insert into each mold comprises placing a deformable spacer insert into the mold.

However, the use of a rigid spacer insert is not excluded.

In an embodiment, the step of placing a deformable spacer insert into the mold comprises placing an elastic spacer insert into the mold (of any material, for example, silicone, neoprene).

However, the use of a spacer insert that deforms plastically is not excluded.

In an embodiment, the step of placing, in each of a set of molds, at least an assembly comprises placing an outer surface of each pin block in contact with the first inner surface of the mold, in order to obtain the outer surface of each pin block exposed from the package when the corresponding electronic device is removed from the mold.

However, the same solution may also be applied to other electronic devices (for example, with gull-wing terminals, or even not of the surface-mounting type).

In an embodiment, the step of placing a spacer insert into the mold comprises placing the spacer insert with a main portion in contact with the outer surface of the heat sink and a side portion protruding from the main portion towards the first heat sink in contact with a further outer surface of each pin block, in order to obtain further outer surface of each pin block exposed from the package when the corresponding electronic device is removed from the mold.

However, it is possible to use a spacer insert of any shape (e.g., with any number of portions protruding downwards, down to none) and/or type (e.g., consisting of several separated parts).

In an embodiment, the step of placing, in each one of a set of molds, at least one assembly comprises placing a plurality of assemblies into each mold; moreover, the step of placing a spacer insert into each mold comprises placing the spacer insert into the mold in contact with the outer surface of the second heat sink of each of the assemblies before filling the mold with the insulating material.

However, it is possible to place any number (≥2) of assemblies into each mold; on the contrary, it is also possible to place a single assembly into each mold.

In an embodiment, the step of placing, in each one of a set of molds, at least one assembly comprises interposing at least one removable protective sheet between the at least one assembly and the corresponding mold.

However, the protective sheet may have any shape, size and/or be made of any other materials (also being non-heat-resistant when the insulating material is chemically hardened).

In an embodiment, the step of interposing at least one removable protective sheet between the least one assembly and the corresponding mold comprises placing a first removable protective sheet into a first half-mold of the mold, and placing a second removable protective sheet into a second half-mold of the mold.

However, the protective sheets may be in any number (even just one).

In an embodiment, the step of placing, in each one of a set of molds, at least one assembly is performed simultaneously for a plurality of molds; this is achieved by means of the operations of arranging the corresponding assemblies on first half-molds of the corresponding molds comprised in a first common matrix, and covering the assemblies with second half-molds of the corresponding molds comprised in a second common matrix.

However, the assemblies may be arranged in the corresponding molds in other ways, also in succession (e.g., by means of a pick-and-place head).

In an embodiment, the step of placing the corresponding assemblies on first half-molds of the corresponding molds comprised in a common matrix comprises placing a common leadframe on the first common matrix; the corresponding leadframe comprises the corresponding first heat sinks and the corresponding pin blocks.

However, the assemblies may be mounted on a different structure, or may also be completely separated from each other.

What is claimed is:

1. A process for manufacturing dual side cooling type electronic devices, comprising:
    placing, in each one of a set of molds, at least one assembly comprising a first heat sink, at least one chip of semiconductor material mounted on the first heat sink, a second heat sink mounted on said at least one chip and a plurality of pin blocks electrically connected to said at least one chip, the first heat sink having an outer surface in contact with a first inner surface of the mold,
    placing a spacer insert into each mold in contact with an outer surface of the second heat sink,
    filling each mold with insulating material in the liquid state,
    hardening the insulating material, and
    extracting a resulting electronic device from each mold, wherein the hardened insulating material forms a protective package for said at least one chip that exposes both the outer surface of the first heat sink and the outer surface of the second heat sink, the resulting electronic device being separate from the spacer insert.

2. The process according to claim 1, wherein placing a spacer insert into each mold comprises: placing a deformable spacer insert into the mold.

3. The process according to claim 2, wherein placing a deformable spacer insert into the mold comprises: placing an elastic spacer insert into the mold.

4. The process according to claim 1, wherein placing, in each one of a set of molds, at least one assembly comprises:
    placing an outer surface of each pin block in contact with the first inner surface of the mold for obtaining the outer surface of each pin block exposed from the package when the corresponding electronic device is removed from the mold.

5. The process according to claim 1, wherein placing a spacer insert into the mold comprises:
    placing the spacer insert with a main portion in contact with the outer surface of the second heat sink and a side portion protruding from the main portion towards the first heat sink in contact with a further outer surface of each pin block for obtaining the further outer surface of each pin block being exposed from the package when the corresponding electronic device is removed from the mold.

6. The process according to claim 1,
    wherein placing, in each one of a set of molds, at least one assembly comprises placing a plurality of assemblies into each mold, and
    wherein placing a spacer insert into each mold comprises placing the spacer insert into the mold in contact with the outer surface of the second heat sink of each of the assemblies before filling the mold with the insulating material.

7. The process according to claim 1, wherein placing, in each one of a set of molds, at least one assembly is performed simultaneously for a plurality of molds by:
  placing the corresponding assemblies on first half-molds of the corresponding molds comprised in a first common matrix, and
  covering the assemblies with second half-molds of the corresponding molds comprised in a second common matrix.

8. The process according to claim 7, wherein placing the corresponding assemblies on first half-molds of the corresponding molds comprised in a first common matrix comprises:
  placing a common leadframe on the first common matrix, the leadframe comprising the corresponding first heat sinks and the corresponding pin blocks.

9. A process, comprising:
  placing a circuit assembly in a bottom half of a mold, said bottom half of the mold including a first inner surface and said circuit assembly comprising a first heat sink having a lower surface in contact with the first inner surface, a pin block having a lower surface in contact with the first inner surface, a semiconductor chip in electrical connection with at least the pin block, and a second heat sink in contact with the semiconductor chip;
  placing a spacer insert within an upper half of the mold, said upper half of the mold including a second inner surface and said spacer insert placed in contact with the second inner surface;
  coupling the upper half of the mold to the bottom half of the mold to enclose the circuit assembly with the spacer insert in contact with an upper surface of the second heat sink;
  injecting a cavity formed by the coupled upper half and lower half with an insulating material;
  hardening the insulating material; and
  extracting the hardened insulating material encapsulating the circuit assembly from the mold with the lower surface of the first heat sink, the lower surface of the pin block and the upper surface of the second heat sink exposed at an outer surface of the hardened insulating material, the hardened insulating material encapsulating the circuit assembly being separate from the spacer insert.

10. The method of claim 9, wherein placing the spacer insert within the upper half of the mold comprises placing the spacer insert in contact with the second inner surface and a third inner surface of the upper half of the mold which is perpendicular to the second inner surface, the spacer insert further contacting, when the upper half of the mold is coupled to the bottom half of the mold, an upper surface of the pin block.

11. The method of claim 10, wherein extracting further comprises the upper surface of the pin block being exposed at the outer surface of the hardened insulating material.

12. The method of claim 9, wherein placing a circuit assembly in the bottom half of the mold comprises placing a first circuit assembly and a second circuit assembly in the bottom half of the mold, further comprising:
  placing a sacrificial joint between the first circuit assembly and the second circuit assembly;
  extending a septum from the spacer insert between the first circuit assembly and the second circuit assembly and in contact with the sacrificial joint.

13. The method of claim 12, further comprising, after extracting, severing the sacrificial joint.

14. A process, comprising:
  placing a first sheet in a bottom half of a mold, said bottom half of the mold including a first inner surface to which the first sheet is in contact;
  placing a circuit assembly in the bottom half of the mold, said circuit assembly comprising a first heat sink having a lower surface in contact with the first sheet, a pin block having a lower surface in contact with the first sheet, a semiconductor chip in electrical connection with at least the pin block, and a second heat sink in contact with the semiconductor chip;
  placing a spacer insert within an upper half of the mold and in contact with a second inner surface;
  placing a second sheet in the upper half of the mold in contact with the spacer insert;
  coupling the upper half of the mold to the bottom half of the mold to enclose the circuit assembly with the second sheet in contact with an upper surface of the second heat sink;
  injecting a cavity formed by the coupled upper half and lower half with an insulating material;
  hardening the insulating material; and
  extracting the hardened insulating material encapsulating the circuit assembly from the mold with the lower surface of the first heat sink, the lower surface of the pin block and the upper surface of the second heat sink exposed at an outer surface of the hardened insulating material, the hardened insulating material encapsulating the circuit assembly being separate from the spacer insert.

15. The method of claim 14, wherein placing the spacer insert within the upper half of the mold comprises placing the spacer insert in contact with the second inner surface and a third inner surface of the upper half of the mold which is perpendicular to the second inner surface, and wherein placing the second sheet in the upper half of the mold comprises placing the second sheet in contact, when the upper half of the mold is coupled to the bottom half of the mold, with an upper surface of the pin block.

16. The method of claim 15, wherein extracting further comprises the upper surface of the pin block being exposed at the outer surface of the hardened insulating material.

17. The method of claim 14, wherein placing a circuit assembly in the bottom half of the mold comprises placing a first circuit assembly and a second circuit assembly in the bottom half of the mold, further comprising:
  placing a sacrificial joint between the first circuit assembly and the second circuit assembly;
  extending a septum from the spacer insert between the first circuit assembly and the second circuit assembly.

18. The method of claim 17, further comprising, after extracting, severing the sacrificial joint.

* * * * *